(12) United States Patent
Ritchey et al.

(10) Patent No.: US 6,919,774 B2
(45) Date of Patent: Jul. 19, 2005

(54) BROADBAND PIN DIODE ATTENUATOR BIAS NETWORK

(75) Inventors: Carey Ritchey, Plano, TX (US); Tom L. Davis, Carrollton, TX (US)

(73) Assignee: Microtune (Texas), L.P., Plano, TX (US)

( * ) Notice: Subject to any disclaimer, the term of this patent is extended or adjusted under 35 U.S.C. 154(b) by 114 days.

(21) Appl. No.: 09/970,351

(22) Filed: Oct. 3, 2001

(65) Prior Publication Data

US 2003/0062967 A1 Apr. 3, 2003

(51) Int. Cl.$^7$ .............................. H03H 7/25; H01P 1/22
(52) U.S. Cl. ...................... 333/81 R; 327/308; 327/325
(58) Field of Search ......................... 333/81, 100, 17.1, 333/81 R; 455/249.1; 327/325, 308, 314, 320, 309

(56) References Cited

U.S. PATENT DOCUMENTS

| | | | |
|---|---|---|---|
| 3,453,564 A | | 7/1969 | Russell ...................... 333/81 R |
| 3,713,037 A | * | 1/1973 | Hofer ....................... 333/81 R |
| 4,216,445 A | * | 8/1980 | Abajian ..................... 333/81 R |
| 4,590,417 A | | 5/1986 | Tanaami et al. ............. 323/229 |
| 4,754,240 A | * | 6/1988 | Marconi .................... 333/81 A |
| 4,942,375 A | * | 7/1990 | Petitjean et al. .......... 333/81 R |
| 6,285,865 B1 | | 9/2001 | Vorenkamp et al. ......... 455/307 |
| 6,448,867 B1 | * | 9/2002 | Kossor ...................... 333/81 A |

FOREIGN PATENT DOCUMENTS

| | | | |
|---|---|---|---|
| JP | 61 198806 A | | 9/1986 |
| JP | 63 039207 A | | 2/1988 |
| JP | 06152301 A | * | 5/1994 |
| JP | 2000 286659 A | | 10/2000 |

OTHER PUBLICATIONS

PCT International Search Report for PCT/US02/31259 dated Dec. 15, 2003.

"A Wideband General purpose PIN Diode Attenuator," pp. 1–11, APN 1003, Copyright Alpha Industries, Inc., 1999.

Addendum to Hewlett–Packard Application Note 1048 "A Low–Cost Surface Mount PIN Diode π Attenuator," R. Waugh, Rev. Feb. 5, 1996, 4 pages.

"Low Distortion Attenuator Plastic Packaged PIN Diodes," Alpha Industries, Inc. SMP1304 Series, pp. 1–4, Jun. 1999.

"Linear Models for Diode Surface Mount Packages," Hewlett–Packard Application Note 1124, copyright 1997, Hewlett–Packard Co., 5966–0399E(Aug. 1997).

"Surface Mount PIN Diodes," Hewlett–Packard Technical Data, HSMP–38XX and HSMP–48XX Series, pp. 1–12, Copyright 1999 Hewlett–Packard Co., Obsoletes 5968–3435E (Jun. 1999).

"A CATV Attenuator Using the Single Package SMP1307–027 PIN Diode Array," Alpha Industries, Inc. APN1017, pp. 1–9, Nov. 1999.

"Surface Mount RF PIN Low Distortion Attenuator Diodes," Agilent Technologies, Technical Data, HSMP–381xSeries and HSMP–481xSeries, pp. 1–8, Copyright 1999 Agilent Technologies, Obsoletes 5091–4932E (Nov. 1999).

"A Low Distortion PIN Diode Switch Using Surface Mount Devices," Agilent Technologies, Application Note 1049, pp. 1–10, Copyright 1999 Agilent Technologies, Obsoletes 5091–4932E, 5966–0780E (Nov. 1999).

* cited by examiner

*Primary Examiner*—Stephen E. Jones
(74) *Attorney, Agent, or Firm*—Fulbright & Jaworski LLP

(57) ABSTRACT

Diode network configurations are disclosed in which cathode bias voltage is held substantially constant to provide an attenuator circuit in which return loss is optimized throughout a broad dynamic attenuation range. Preferred embodiments include PIN diodes arranged in a π network having two attenuation control signals provided thereto. Alternative embodiments include PIN diodes arranged in a T network having two attenuation control signals provided thereto.

35 Claims, 3 Drawing Sheets

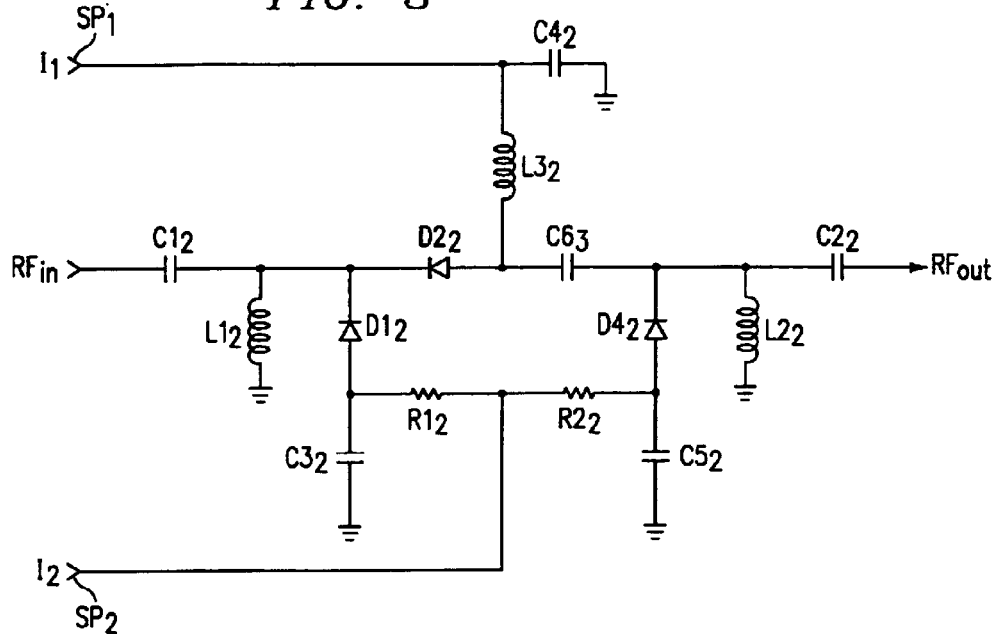
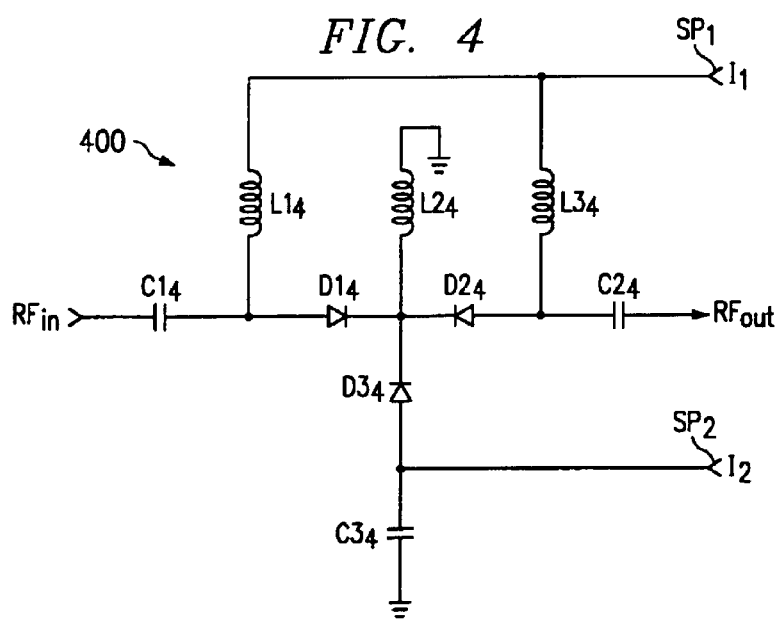

BROADBAND PIN DIODE ATTENUATOR BIAS NETWORK

RELATED APPLICATIONS

The present application is related to concurrently filed commonly assigned United States patent application Ser. No. [49581-P029US-10103788] entitled "Linearizer for a PIN Diode Attenuator," the disclosure of which is hereby incorporated herein by reference.

TECHNICAL FIELD

The invention relates generally to signal attenuators and, more particularly, to a controllable attenuator using positive-intrinsic-negative (PIN) diodes.

BACKGROUND

A common requirement in radio frequency (RF) circuits is the control of RF signal levels. For example, often in RF systems, such as CATV cable television systems, RF signal levels vary significantly resulting in unpredictable and/or undesired operation of particular components thereof, such as receivers, tuners, repeaters, and the like. Accordingly, such systems often utilize controllable signal attenuators, such as at the input stage of one of the aforementioned components, in order to provide a relatively constant RF signal level as provided to such components.

Often the above mentioned controllable attenuators are provided with a voltage controlled RF attenuator such as a linear attenuator. A linear attenuator typically has three ports or interfaces; those being an RF input port, an RF output port, and a control input. Ideally, a linear attenuator provides attenuation (generally expressed in decibels) between the RF input and RF output ports that is a linear function of a control signal. Other desirable attributes of a linear attenuator may include maintaining a good impedance match at the RF ports with respect the circuit coupled thereto over the control and frequency range, providing a flat attenuation response over a wide band of frequencies, introducing little or no excess noise into the circuit, and generating little or no distortion in the signals attenuated thereby. In RF systems that operate with signals of more than one octave of RF spectrum (broadband) the attenuator must also ensure that, in addition to acting as an attenuator, the RF impedance (return loss) of both the input and output of the attenuator is held as close as possible to the desired system impedance. Failure to maintain a proper impedance match can greatly affect the system frequency response (power transfer) and noise figure.

However, prior art linear attenuators generally provide a tradeoff with respect to these desirable attributes and, therefore, often provide less than ideal operation in demanding system applications. For example, there is generally a trade off between providing a flat attenuation response across a broadband signal and maintaining a good impedance match throughout the control and frequency range. Similarly, previous attenuation circuit implementations have experienced a trade off between providing attenuation that is a linear function of the control input and providing a low insertion loss. Specifically, PIN diode attenuator circuits are available that will provide a decibel per volt linearization, but typically will have a minimum of approximately 3 to 4 dB insertion loss.

One common implementation of a linear attenuator consists of a two section embodiment including a PIN diode attenuator section and a linearizer section coupled to the PIN diode attenuator section. In such a configuration, a PIN diode network, such as a π network or a bridge T network, and passive bias components form the PIN diode attenuator section and provide attenuation of signals passed therethrough in response to a control voltage. Specifically, the PIN diodes exhibit a variable RF resistance that is inversely proportion to the DC current through the diode and, therefore, the arrangement of PIN diodes and the corresponding bias components provides a circuit in which variable attenuation is achieved in response to a control voltage applied to bias components.

Such a PIN diode attenuator transfer function of RF attenuation versus DC current is non-linear due to the non-linear RF resistance of the PIN diodes versus bias current. Accordingly, a linearizer section is provided to allow a linear control voltage applied to an input of the linearizer section to result in a corresponding linear attenuation response of an RF signal applied to the PIN diode attenuator section.

Next-generation digital cable set-top boxes, such as those conforming to the OPENCABLE tuner specifications from Cable Television Laboratories, Inc., must provide attenuation in a large dynamic range (gain control range), such as on the order of 30 dB of dynamic range and beyond, while maintaining the RF input impedance of the device, such as 75 ohms. However, PIN diode attenuator configurations, such as those described above, have heretofore been unable to adequately address such requirements. For example, previously known bridge T attenuator structures are precluded for use in the above conditions as 30 dB of dynamic range are not available with commercially available PIN diodes in the prior art bridge T network configurations. Similarly, previously known π attenuator structures, although perhaps able to achieve a relatively large dynamic range, generally are not able to maintain the return loss or impedance match over this dynamic range. For example, typical prior art π attenuator structures result in poor return loss with designs with greater than 15 dB of attenuation range.

Accordingly, a need exists in the art for a controllable attenuator circuit which provides an excellent return loss over a relatively large attenuation range.

SUMMARY OF THE INVENTION

The present invention is directed to a system and method in which PIN diode networks are configured to provide controllable attenuators having a relatively good input and output return loss over a relatively large dynamic range. Preferred embodiments of the present invention provide PIN diode attenuators which are controlled by the application of control (bias) current at two control ports of the PIN diode network.

A preferred embodiment PIN diode attenuator is provided by connecting the PIN diodes in a π network. Preferably, the cathodes of all PIN diodes in the π network are DC grounded, such as through large value inductors coupling the cathodes to a DC ground, providing a common cathode point bias voltage which is constant. The preferred embodiment arrangement provides for control current to be applied to the π network shunt diodes and series diode(s) separately. Accordingly, although the complexity of the attenuator control circuitry is increased by the preferred embodiment multiple control current configuration, this configuration allows control of diode currents independently of each other and, therefore, at any given point the preferred embodiment attenuator circuit may be optimized both for insertion loss and return loss. Moreover, controllable attenuators of the present invention provide a large dynamic range. PIN diode attenuators of the present invention have been proven to exceed 35 dB of attenuation range, while maintaining a return loss better than 16 dB.

Alternative embodiments of the present invention provide a PIN diode attenuator by connecting the PIN diodes in a bridge T network. Preferably, the cathodes of all PIN diodes in the T network are DC grounded, such as through a large value inductor coupling the cathodes to a DC ground, providing a common cathode point bias voltage which is constant. As with the preferred embodiment $\pi$ network discussed above, the preferred embodiment T network arrangement provides for control current to be applied to the T network shunt diode and series diodes separately. Accordingly, although the complexity of the attenuator control circuitry is increased by the this multiple control current configuration, this configuration allows control of diode currents independently of each other and, therefore, at any given point the preferred embodiment attenuator circuit may be used to optimize its insertion loss and return loss.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIG. 3 shows an alternative embodiment $\pi$ network PIN diode attenuator circuit of the present invention; and FIG. 4 shows an alternative embodiment T network PIN diode attenuator circuit of the present invention.

DETAILED DESCRIPTION

Figure 1:
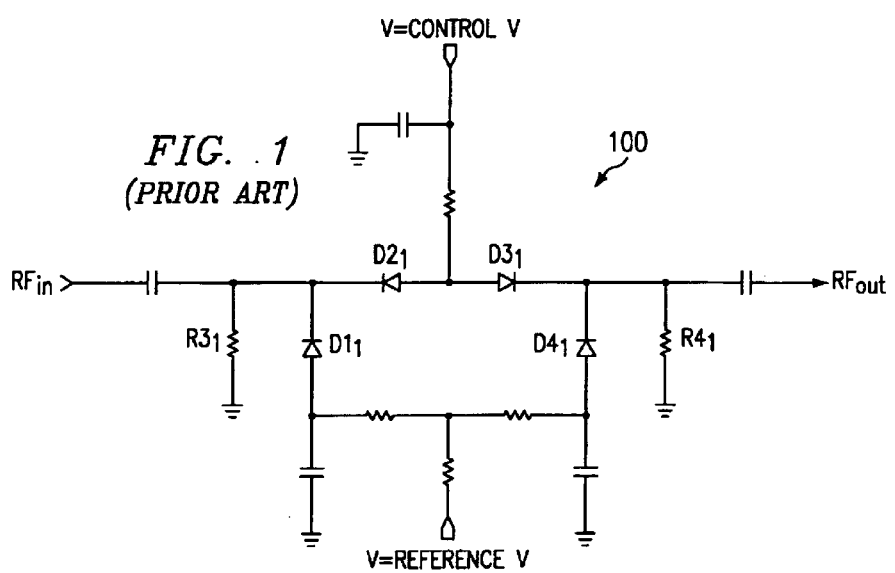
FIG. 1 shows a typical prior art PIN diode attenuator circuit.

A discussion of a typical prior art PIN diode attenuator circuit is helpful in understanding the present invention. Directing attention to FIG. 1, a typical prior art PIN diode attenuator circuit is shown as attenuator 100. PIN diodes exhibit a variable RF resistance that is inversely proportional to the DC current through the diode. The design of attenuator 100 requires arranging the PIN diodes to form a suitable RF attenuator network while providing DC bias current to each of the PIN diodes. Accordingly, attenuator 100 includes two PIN diodes arranged in a common cathode configuration (diodes $D1_1$ and $D2_1$) which are mirrored (diodes $D3_1$ and $D4_1$) to form a configuration commonly referred to as a $\pi$ network.

The common cathode nodes of attenuator 100 are coupled to a DC ground (whether zero potential ground or some potential with respect thereto) through resistors ($R3_1$ for the common cathode node of $D1_1$ and $D2_1$ and $R4_1$ for the common cathode node of $D3_1$ and $D4_1$). Resistors $R3_1$ and $R4_1$ are used to adjust the voltage present at that common cathode point as a function of the control voltage ($V_{control}$). The control voltage in attenuator 100 is provided to the pairs of diodes at the common anode node of $D2_1$ and $D3_1$. As the control voltage is applied across one diode at the anode node, the corresponding cathode voltage will have a tendency to rise or fall, therefore adjusting the bias in the corresponding diode of the pair. As the current through a shunt diode (diode $D1_1$ or $D4_1$) is increased, the current through the corresponding series diode (diode $D2_1$ or $D3_1$, respectively) will decrease, and vice versa. With the control voltage $V_{control}$ low, $D2_1$ and $D3_1$ are biased off and $D1_1$ and $D4_1$ receive DC bias from the reference voltage $V_{reference}$ resulting in a high attenuation. As the control voltage $V_{control}$ is increased, $D2_1$ and $D3_1$ start receiving current from $V_{control}$ and stealing current from $D1_1$ and $D4_1$ resulting in a lower attenuation.

In this design approach, both the series and shunt diodes are driven by a single control signal $V_{control}$, therefore only requiring a single control voltage relative to a standard reference voltage. Unfortunately, however, this design approach does not maintain the RF impedance of the two diodes, and therefore the attenuator input impedance (as seen by $RF_{in}$) and the attenuator output impedance (as seen by $RF_{out}$) over the attenuation range. Accordingly, a challenge with respect to implementing this prior art approach is selecting values of the resistors and $V_{reference}$ that simultaneously satisfy both attenuation range and return loss requirements. However, it has been found that, under the above mentioned circuit conditions, it is not possible to achieve optimal return loss over a range of more than approximately 15 dB of attenuation variation. Failure to maintain a proper impedance match can greatly affect the system frequency response (power transfer) and noise figure.

Figure 2:
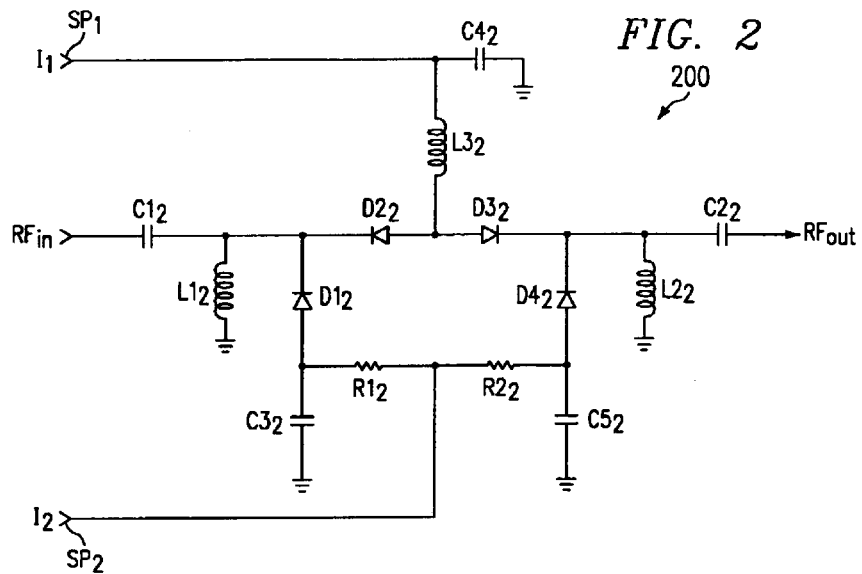
FIG. 2 shows a preferred embodiment $\pi$ network PIN diode attenuator circuit of the present invention.

Directing attention to FIG. 2, a preferred embodiment PIN diode attenuator circuit of the present invention is shown as attenuator 200. Attenuator 200 includes an RF input port ($RF_{in}$) and an RF output port ($RF_{out}$), such that an RF signal introduced to the RF input port is controllably attenuated by attenuator 200 for output at the RF output port. Attenuator 200 further includes two control current input ports ($SP_1$ and $SP_2$) for use in controllably attenuating an RF signal passed therethrough. The control currents $I_1$ and $I_2$ are preferably provided by a linearizer circuit, such as shown and described in the above referenced patent application entitled "Linearizer for a PIN Diode Attenuator," to thereby provide linear attenuation control of the RF signal.

PIN diodes $D1_2$–$D4_2$ of the preferred embodiment attenuator 200 are provided in an unbalanced, symmetrical $\pi$ network configuration. Preferably, PIN diodes utilized in a PIN diode attenuator of the present invention are ones which are well modeled by the equation $$R = \frac{K}{I^a} + R_s,$$

and for which $0.7 \leq \alpha \leq 1$ and $Z_0 \gg R_s$ are substantially true (e.g., $\alpha$ is less than 1 and $R_s$ is approximately 1 ohm). A preferred embodiment utilizes PIN diodes providing dynamic impedance range of from approximately 1/20th up to approximately 20 times the characteristic impedance of the circuit into which the PIN diode attenuator is to be placed.

Capacitors $C1_2$ and $C2_2$, such as may be approximately 150 pF in a preferred embodiment, preferably provide DC blocks at the attenuator input and output ports. According to preferred embodiments, capacitors $C1_2$ and $C2_2$ cooperate with inductors $L1_2$ and $L2_2$, respectively, to form high pass filters that extend the low frequency performance of the circuit. Cable television signals, for example, are very broadband and, therefore, low value capacitors provided as capacitors $C1_2$ and $C2_2$ is counter intuitive. However, experimentation has revealed that these low value capacitors providing the above high pass filter arrangement provides improved low frequency response.

Capacitors $C3_2$–$C5_2$, such as may be approximately 10,000 pF in a preferred embodiment, preferably provide RF shorts to ground. Inductors $L1_2$ and $L2_2$, such as may be approximately 820 nH in a preferred embodiment, and inductor $L3_2$, such as may be approximately 1,500 nH in a preferred embodiment, pass DC bias currents but present high impedance at RF frequencies. Resistors $R1_2$ and $R2_2$, such as may be approximately 470 ohms in a preferred embodiment, preferably decouple the anodes of $D1_2$ and $D4_2$ to thereby block a possible RF leakage path.

In the $\pi$ network configuration of FIG. 2, PIN diodes $D1_2$ and $D2_2$ are coupled in a common cathode configuration with PIN diodes $D4_2$ and $D3_2$ mirrored with respect thereto. Specifically, the two series diodes, $D2_2$ and $D3_2$, are disposed in anti-phase or a common anode configuration. This configuration improves the dynamic range over the linearity of the structure by having the second order products of one diode canceled out by the opposite, non-linear portion generated in the series diode pair. The two shunt diodes, $D1_2$ and $D4_2$, are connected to the two series diodes in a common cathode configuration.

In contrast to the attenuator configuration shown in FIG. 1, attenuator 200 of the preferred embodiment includes inductors $L1_2$ and $L2_2$ effectively providing a DC short to ground at the common cathode nodes. Specifically, the common cathode nodes are connected through RF inductors of a large enough value to have an impedance to make it not appear in the RF spectrum for which attenuator 200 is used to attenuate signals. Accordingly, the common cathode points of attenuator 200 have a constant DC bias voltage associated therewith in an implementation which does not significantly affect the RF characteristics of the signal path between $RF_{in}$ and $RF_{out}$. Moreover, it should be appreciated that, by employing a configuration in which a minimum number of inductors are used (three in the preferred embodiment) frequency disturbances caused by such inductors is further minimized.

With the common cathode points of attenuator 200 configured to have a constant DC bias voltage, the preferred embodiment configuration of attenuator 200 provides for separate control of series diodes $D2_2$ and $D3_2$, controlled by a control current provided to port $SP_1$, and shunt diodes $D1_2$ and $D4_2$, controlled by a control current provided to port $SP_2$. As a result, the return loss of the attenuator can be optimized for any desired insertion loss and return loss.

Accordingly, the preferred embodiment configuration described above allows attenuator 200 to operate in a multi-octave structure, such as with the CATV spectrum of frequencies, typically 45 MHz to 870 MHz. Experimentation using the above described preferred embodiment values for the individual components of attenuator 200 has revealed that this preferred embodiment circuit provides in excess of 35 dB of dynamic attenuation range, while maintaining a return loss better than 16 dB, when utilized with the CATV spectrum.

As mentioned above, the two shunt diodes, $D1_2$ and $D4_2$, are connected through two series steering resistors, $R1_2$ and $R2_2$, according to the preferred embodiment. However, it should be appreciated that the use of these steering resistors are provided in the preferred embodiment for simplification with respect to the circuitry controlling attenuator 200. Accordingly, these two steering resistors are not necessary for implementation of a controllable attenuator of the present invention.

Figure 2A:
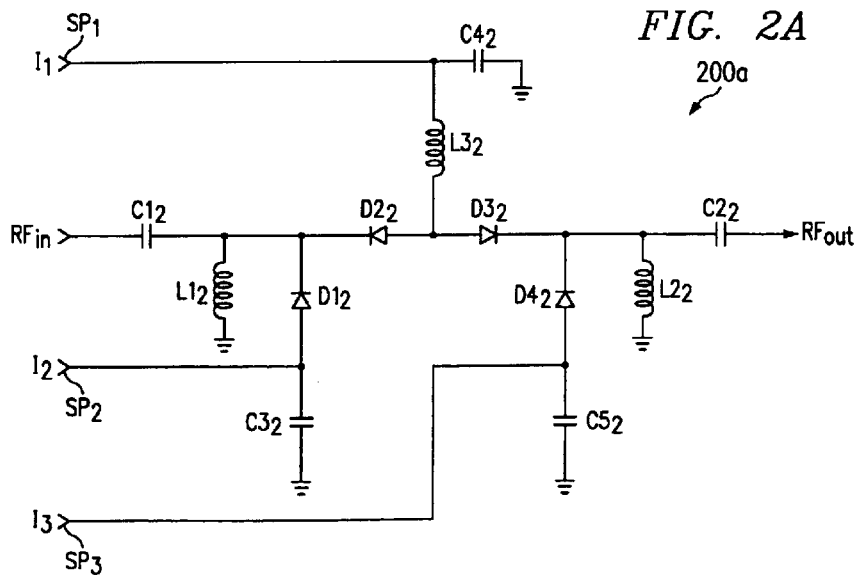
FIG. 2A shows an alternative embodiment $\pi$ network PIN diode attenuator circuit of the invention.

According to an alternative embodiment 200a of the present invention depicted in FIG. 2A, steering resistors $R1_2$ and $R2_2$ are omitted and the two shunt diodes, $D1_2$ and $D4_2$, are provided independent attenuator control currents $I_2$ and $I_3$. This embodiment of the present invention provides additional flexibility with respect to optimizing the match on either end of the attenuator to the characteristic impedance of the circuit into which it is inserted. For example, this alternative embodiment allows matching from a 50 ohm system to a 75 ohm system, if desired.

As discussed above, diodes $D2_2$ and $D3_2$ in the series arm of the $\pi$ network serve to suppress even order RF distortion since the distortion induced in $D2_2$ is canceled by that in $D3_2$. However, if even order RF distortion is not a concern in a particular implementation, it should be appreciated that the attenuator can be simplified by replacing one of the series diodes with a capacitor as shown in the alternative embodiment of FIG. 3. Specifically, in the alternative embodiment of FIG. 3 diode $D3_2$ has been replaced with capacitor $C6_3$, such as may be approximately 10,000 pF, to thereby provide an attenuator of the present invention without the advantage of the anti-phase or a common anode series diode configuration. However, this configuration provides the cost advantage associated with omitting one diode in favor or a typically less expensive capacitor (which may be significant in mass production quantities) in addition to avoiding the insertion loss caused by that single diode. This alternative embodiment implementation might typically be used in applications where the absolute level of the RF signal applied to the attenuator is low enough that the non-linear effects of the diodes will not have a substantial effect on the operating characteristics of the circuit.

Directing attention to FIG. 4, another alternative embodiment of the present invention is shown. Attenuator 400 of FIG. 4 is provided by PIN diodes, diodes $D1_4$–$D3_4$, such as may be provided by PIN diodes as described above, arranged in a T network. Specifically, attenuator 400 includes two series diodes, $D1_4$ and $D2_4$, in the RF path and one shunt diode, $D3_4$.

As with attenuator 200 described above, attenuator 400 includes an RF input port ($RF_{in}$) and an RF output port ($RF_{out}$), such that an RF signal introduced to the RF input port is controllably attenuated by attenuator 400 for output at the RF output port. Attenuator 400 further includes two control current input ports ($SP_1$ and $SP_2$) for use in controllably attenuating an RF signal passed therethrough. The control currents $I_1$ and $I_2$ are preferably provided by a linearizer circuit, such as described in the above referenced patent application entitled "Linearizer for a PIN Diode Attenuator," to thereby provide linear attenuation control of the RF signal.

Capacitors $C1_4$ and $C2_4$, such as may be approximately 150 pF in a preferred embodiment, preferably provide DC blocks at the attenuator input and output ports. Capacitor $C3_4$, such as may be approximately 10,000 pF in a preferred embodiment, preferably provides an RF short to ground. Inductor $L2_4$, such as may be approximately 1,500 nH in a preferred embodiment, and inductors $L1_4$ and $L3_4$, such as may be approximately 820 nH in a preferred embodiment, pass DC bias currents but present high impedance at RF frequencies. Preferably, the particular inductors selected for use according to the present invention are selected to be as large as possible to appear as a DC short and an open circuit at high frequencies with the constraint that often large inductors are of poor quality, e.g., have parasitics associated therewith. Preferred embodiments of the present invention may be configured with components varying within approximately 20% of the above specified values.

In the T network configuration of FIG. 4, PIN diodes $D1_4$–$D3_4$ are coupled in a common cathode configuration. The two series diodes, $D1_4$ and $D2_4$, are also disposed in a common cathode configuration. This common collector configuration improves the dynamic range over the linearity of the structure by having the second order products of one diode canceled out by the opposite, non-linear portion generated in the series diode pair.

Similar to the preferred embodiment configuration of FIG. 2, attenuator 400 of this alternative embodiment includes inductor $L2_4$ effectively providing a DC short to ground at the common cathode node. Specifically, the common cathode node is connected through an RF inductor of a large enough value to have an impedance to make it not appear in the RF spectrum for which attenuator 400 is used to attenuate signals. Accordingly, the common cathode point of attenuator 400 has a constant DC bias voltage associated therewith in an implementation which does not significantly affect the RF characteristics of the signal path between $RF_{in}$ and $RF_{out}$. Moreover, it should be appreciated that, by employing a configuration in which a minimum number of inductors are used (three in the preferred embodiment) frequency disturbances caused by such inductors is further minimized.

With the common cathode point of attenuator 400 configured to have a constant DC bias voltage, the preferred embodiment configuration of attenuator 400 provides for separate control of series diodes $D1_4$ and $D2_4$, controlled by a control current provided to port $SP_1$, and shunt diode $D3_4$, controlled by a control current provided to port $SP_2$. As a result, the return loss of the attenuator can be optimized for any desired insertion loss and return loss. Accordingly, the preferred embodiment configuration described above allows attenuator 400 to be used to optimize insertion loss and return loss over a band in excess of 35 dB, as well as maintaining return losses in excess of 15 to 16 dB.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A controllable attenuator comprising:
   an RF input port;
   an RF output port; and
   a plurality of diodes disposed in a predetermined network configuration, wherein at least one diode of said plurality of diodes is disposed in a signal path between said RF input port and said RF output port, wherein at least one other of said diodes is disposed in a shunt configuration, and wherein the predetermined network configuration provides a constant DC bias voltage at a cathode of each diode of said plurality of diodes and a control signal at an anode of the at least one shunt diodes via a resistor.

2. The attenuator of claim 1, wherein said plurality of diodes comprise PIN diodes.

3. The attenuator of claim 1, wherein said predetermined network configuration comprises a $\pi$ network.

4. The attenuator of claim 3, wherein said at least one diode disposed in a signal path between said RF input port and said RF output port is one diode.

5. The attenuator of claim 4, wherein an anode of said one diode is coupled to a first control signal input via a first inductor to thereby allow DC bias current provided at said first control signal input to reach said anode and to substantially prevent an RF signal appearing at said anode from reaching said first control signal input.

6. The attenuator of claim 3, wherein said at least one diode disposed in a signal path between said RF input port and said RF output port comprises two diodes disposed in a common anode configuration to thereby provide a common anode node.

7. The attenuator of claim 6, wherein said common anode node is coupled to a first control signal input via an inductor to thereby allow DC bias current provided at said first control signal input to reach said common anode node and to substantially prevent an RF signal appearing at said common anode node from reaching said first control signal input.

8. The attenuator of claim 1, wherein said predetermined network configuration comprises a T network.

9. The attenuator claim 8, wherein said at least one diode disposed in a signal path between said RF input port and said RF output port comprises two diodes disposed in a common cathode configuration to thereby provide a common cathode node.

10. The attenuator of claim 9, wherein an anode of a first diode of said two diodes is coupled to a first control signal input via a first inductor to thereby allow DC bias current provided at said first control signal input to reach said anode of said first diode and to substantially prevent an RF signal appearing at said anode of said first diode from reaching said first control signal input, and wherein an anode of a second diode of said two diodes is coupled to said first control signal input via a second inductor to thereby allow DC bias current provided at said first control signal input to reach said anode of said second diode and to substantially prevent an RF signal appearing at said anode of said second diode from reaching said first control signal input.

11. The attenuator of claim 9, wherein said common cathode node is coupled to DC ground through a third inductor to thereby substantially DC ground said common cathode node.

12. The attenuator of claim 9, wherein a third diode of said plurality of diodes is coupled to said common cathode node.

13. The attenuator of claim 12, wherein an anode of said third diode is coupled to a second control signal input.

14. A controllable attenuator comprising:
an RF input port;
an RF output port; and
a plurality of diodes disposed in a π network configuration, wherein at least two diodes of said plurality of diodes are disposed in a signal path between said RF input port and said RF output port in a common anode configuration to thereby provide a common anode node, wherein the network configuration provides a constant DC bias voltage at a cathode of each diode of said plurality of diodes, wherein a first diode of said two diodes is coupled in a common cathode configuration with a third diode of said plurality of diodes to thereby provide a first common cathode node, a second diode of said two diodes is coupled in a common cathode configuration with a fourth diode of said plurality of diodes to thereby provide a second common cathode node and a control signal is provided at an anode of said third and fourth diodes via a resistor.

15. The attenuator of claim 14, wherein said first common cathode node is coupled to a DC ground through an inductor to thereby substantially DC ground said first common cathode node.

16. The attenuator of claim 15, wherein said second common cathode node is coupled to DC ground through another inductor to thereby substantially DC ground said second common cathode node.

17. A controllable attenuator comprising:
an RF input port;
an RF output port; and
a plurality of diodes disposed in a predetermined network configuration, wherein at least two diodes of said plurality of diodes are disposed in a signal path between said RF input port and said RF output port in a common anode configuration to thereby provide a common anode node, wherein a first diode of said two diodes is coupled in a common cathode configuration with a third diode of said plurality of diodes to thereby provide a first common cathode node, and wherein a second diode of said two diodes is coupled in a common cathode configuration with a fourth diode of said plurality of diodes to thereby provide a second common cathode node, and wherein the predetermined network configuration provides a constant dc bias voltage at a cathode of each diode of said plurality of diodes and a control signal at an anode of said third and fourth diodes via a resistor.

18. The attenuator of claim 17, wherein control signals provided to said first and second common anode nodes are DC bias current signals.

19. The attenuator of claim 17, wherein control signals provided to said first and second control signal inputs are provided by a linearizer circuit adapted to control said attenuator for linear attenuation in response to a control signal provided to said linearizer circuit.

20. The attenuator of claim 17 wherein said common anode node is coupled to a first control signal input via a first inductor to thereby allow DC bias current provided at said first control signal input to reach said common anode node and to substantially prevent an RF signal appearing at said common anode node from reaching said first control signal input.

21. The attenuator of claim 17 wherein said first common cathode node is coupled to DC ground through a second inductor to thereby substantially DC ground said first common cathode node, wherein said second common cathode node is coupled to DC ground through a third inductor to thereby substantially DC ground said second common cathode node.

22. The attenuator of claim 17 wherein an anode of said third diode and an anode of said fourth diode arc coupled to a second control signal input.

23. A system for providing controllable attenuation of an RF signal, said system comprising:
an RF input port;
an RF output port;
a first control signal input port;
a second control signal input port; and
a plurality of diodes disposed in a π network configuration, wherein at least two diodes of said plurality of diodes are disposed in a signal path between said RF input port and said RF output port in a common anode configuration to thereby provide a common anode node, wherein a first diode of said two diodes is coupled in a common cathode configuration with a third diode of said plurality of diodes to thereby provide a first common cathode node, and wherein a second diode of said two diodes is coupled in a common cathode configuration with a fourth diode of said plurality of diodes to thereby provide a second common cathode node, wherein an anode of at least one diode of said plurality of diodes is coupled to said first control signal input and wherein an anode of at least one diode of said plurality of diodes is coupled to said second control signal input via a resistor, and wherein the network configuration provides a constant DC bias voltage at a cathode of each diode of said plurality of diodes.

24. The system of claim 23 wherein said common anode node is coupled to said first control signal input via a first inductor to thereby allow DC bias current provided at said first control signal input to reach said common anode node and to substantially prevent an RF signal appearing at said common anode node from reaching said first control signal input.

25. A system for providing controllable attenuation of an RF signal, said system comprising:
an RF input port;
an RF output port;
a first control signal input port;
a second control signal input port; and
a plurality of diodes disposed in a π network configuration comprising:
an anode of at least one diode of said plurality of diodes coupled to said first control signal input;
an anode of at least one diode of said plurality of diodes coupled to said second control signal input;
two diodes of said plurality of diodes disposed in a signal path between said RF input port and said RF output port in a common anode configuration to provide a common anode node, wherein said common anode node is coupled to said first control signal input via a first inductor to allow DC bias current provided at said first control signal input to reach said common anode node and to substantially prevent an RF signal appearing at said common anode node from reaching said first control signal input;

a first diode of said two diodes coupled in a common cathode configuration with a third diode of said plurality of diodes to provide a first common cathode node;

a second diode of said two diodes coupled in a common cathode configuration with a fourth diode of said plurality of diodes to provide a second common cathode node; and an anode of said third diode and an anode of said fourth diode coupled to said second control signal input via a resistor.

26. The system of claim 25, wherein said first common cathode node is coupled to DC ground through a second inductor to thereby substantially DC ground said first common cathode node, and wherein said second common cathode node is coupled to DC ground through a third inductor to thereby substantially DC ground said second common cathode node.

27. A method for providing controllable signal attenuation, said method comprising:

disposing a plurality of diodes in a π network configuration including at least one diode disposed in a series configuration and at least two diodes disposed in a shunt configuration, and wherein said π network configuration couples a signal input node and a signal output node through said at least one series diode;

providing a first attenuation control signal input coupled to an anode of said at least one series diode;

providing a second attenuation control signal input coupled to an anode of at least one diode of said at least two shunt diodes via a resistor; and controlling a cathode voltage of each diode of said plurality of diodes to have a substantially constant DC voltage.

28. The method of claim 27, wherein said π network configuration includes at least two diodes, and wherein said π network configuration couples said signal input node and said signal output node through said at least two series diodes disposed in a series configuration.

29. The method of claim 27, wherein said controlling a cathode voltage of each diode of said plurality of diodes to have a substantially constant DC voltage comprises:

coupling each said cathode to DC ground through an inductor.

30. The method of claim 27 further comprising:

controlling a first control signal provided to said first attenuation control signal input and a second control signal provided to said second attenuation control signal to provide a desired range of dynamic attenuation while maintaining an impedance of said signal input node substantially constant.

31. The method of claim 30, wherein said impedance of said signal input node is approximately 75 ohms.

32. The method of claim 30, wherein said desired range of dynamic attenuation is at least 30 dB of dynamic range.

33. The method of claim 32, wherein said desired range of dynamic attenuation is at least 35 dB of dynamic range.

34. A method for providing controllable signal attenuation, said method comprising:

disposing a plurality of diodes in a π network configuration including at least one diode disposed in a series configuration and at least two diodes disposed in a shunt configuration, and wherein said π network configuration couples a signal input node and a signal output node through said at least one series diode;

providing a first attenuation control signal input coupled to an anode of said at least one series diode;

providing a second attenuation control signal input coupled to an anode of a first of said at least two shunt diodes;

providing a third attenuation control signal input coupled to an anode of a second of said at least two shunt diodes; and controlling a cathode voltage of each diode of said plurality of diodes to have a substantially constant DC voltage;

controlling a first control signal provided to said first attenuation control signal input, a second control signal provided to said second attenuation control signal, and a third control signal provided to said third attenuation control signal input to provide a desired range of dynamic attenuation while maintaining an impedance of said signal input node substantially constant and maintaining an impedance of said signal output node substantially constant, wherein said impedance of said signal input and said impedance of said signal output are different to thereby provide matching of systems having different characteristic impedances using said π network.

35. A method for providing controllable signal attenuation, said method comprising:

disposing a plurality of diodes in a π network configuration including at least one diode disposed in a series configuration and at least two diodes disposed in a shunt configuration, and wherein said π network configuration couples a signal input node and a signal output node through said at least one series diode;

providing a first attenuation control signal input coupled to an anode of said at least one series diode;

providing a second attenuation control signal input coupled to an anode of at least one diode of said at least two shunt diodes;

providing a third attenuation control signal input coupled to an anode of at least one diode of said at least two shunt diodes;

controlling a cathode voltage of each diode of said plurality of diodes to have a substantially constant DC voltage; and controlling a first control signal provided to said first attenuation control signal input, a second control signal provided to said second attenuation control signal, and a third control signal provided to said third attenuation control signal input to provide a desired range of dynamic attenuation while maintaining an impedance of said signal input node substantially constant and maintaining an impedance of said signal output node substantially constant, wherein said impedance of said signal input and said impedance of said signal output are different to thereby provide matching of systems having different characteristic impedances using said π network.

* * * * *